US006873212B2

(12) United States Patent
Rogers

(10) Patent No.: US 6,873,212 B2
(45) Date of Patent: Mar. 29, 2005

(54) INTEGRATED CIRCUIT RADIO FREQUENCY AMPLIFIER WITH NOTCH FILTER

(75) Inventor: John William Mitchell Rogers, Ottawa (CA)

(73) Assignee: SIGe Semiconductor Inc., Ottawa (CA)

( * ) Notice: Subject to any disclaimer, the term of this patent is extended or adjusted under 35 U.S.C. 154(b) by 660 days.

(21) Appl. No.: 09/858,544

(22) Filed: May 17, 2001

(65) Prior Publication Data

US 2002/0173287 A1 Nov. 21, 2002

(51) Int. Cl.[7] .............................. H04B 7/00; H04B 1/06
(52) U.S. Cl. ................. 330/307; 455/232.1; 455/252.1; 455/307; 455/333; 455/341; 330/254; 330/278
(58) Field of Search ................................ 455/307, 309, 455/312, 318–319, 333, 338, 341, 232.1, 251.1, 252.1; 330/252, 254, 259, 260–261, 270, 273, 276, 278, 282, 292, 299, 307

(56) References Cited

U.S. PATENT DOCUMENTS

| 3,622,887 | A | * | 11/1971 | Byles | 455/250.1 |
|---|---|---|---|---|---|
| 4,249,137 | A | * | 2/1981 | Malchow | 330/283 |
| 4,263,676 | A | * | 4/1981 | Liebel | 455/285 |
| 4,381,487 | A | * | 4/1983 | Erickson | 330/306 |
| 5,375,260 | A | * | 12/1994 | Koike | 455/208 |
| 5,561,398 | A | * | 10/1996 | Rasmussen | 331/36 C |
| 6,058,292 | A | * | 5/2000 | Terreault | 455/78 |

FOREIGN PATENT DOCUMENTS

EP          0 779 707 A1      6/1997

OTHER PUBLICATIONS

J. Macedo, M.A. Copeland, "A 1.9 GHz Silicon Receiver with Monolithic Image Filtering", *IEEE J. Solid–State Circuits*, vol. 33, pp. 378–386, Mar. 1998.

M.A. Copeland, S.P. Voinigescu, D. Marchesan, P. Popescu, M.C. Maliepaard "5–GHz SiGe HBT monolithic radio transceiver with tunable filtering", *IEEE Transactions on Microwave Theory and Techniques*, vol. 48, pp. 170–181, Feb. 2000.

H. Samavati, H.R. Rategh, and T.H. Lee "A 5–GHz CMOS wireless LAN receiver front end", *IEEE J. Solid–State Circuits*, vol. 35, pp. 765–772, May 2000.

Behzad Razavi, *RF Microelectronics*, 1998 Prentice Hall.

J.W.M. Rogers, J.A. Macedo, C. Plett, "A completely integrated 1.9 GHz receiver front–end with monolithic image reject filter and VCO", *IEEE RFIC Symposium*, pp. 143–146, Jun. 2000.

* cited by examiner

*Primary Examiner*—Simon Nguyen
(74) *Attorney, Agent, or Firm*—Freedman & Associates

(57) ABSTRACT

An integrated circuit superheterodyne radio receiver includes a notch filter coupled with an amplifier for amplifying radio frequency (RF) signals to improve image signal rejection. The notch filter includes a first oscillator circuit with a tank circuit having a resonant frequency corresponding to the unwanted image frequency signal. A control circuit includes a second oscillator circuit, a master bias circuit and a slave bias circuit. The second oscillator circuit is substantially similar to the first oscillator circuit. The master bias circuit is responsive to an amplitude of oscillatory signals in the second oscillator circuit for limiting a flow operating current such that the second oscillator circuit is restrained to operate in a marginally oscillatory state. A slave bias circuit is responsive to the master bias circuit for similarly limiting a flow of current, for operating the first oscillator circuit. A coupling transformer is connected between the amplifier and the first oscillator circuit for exchanging signal energies between the first oscillator circuit and the amplifier such that the first oscillator circuit is reduced to a marginally quiescent state of operation while loaded by the amplifier. An input impedance of the amplifier is thereby raised at frequencies near the image signal frequency, improving the image signal rejection.

13 Claims, 2 Drawing Sheets

INTEGRATED CIRCUIT RADIO FREQUENCY AMPLIFIER WITH NOTCH FILTER

FIELD OF THE INVENTION

The invention is in the field of radio receivers, and filters for radio receivers. More particularly the invention is concerned with filter designs suitable for integration, on-chip, with a radio frequency amplifier useful as a front end of a radio receiver or transceiver.

BACKGROUND

A radio frequency (RF) signal usually consists of a carrier with information modulated on it. The task of the front-end of a radio receiver is to amplify the RF signal and mix it either to base band or to some intermediate frequency (IF) such that the information can be conveniently detected. Reception of a desired RF signal is often depreciated by the presence of an interference signal being received along with the RF signal. When the interference signal is of a constant frequency, it is usual practice to substantially eliminate the effect of the interference signal by using a filter for that purpose, in the radio receiver.

A radio receiver in which the signal is converted directly to base band is known as a homodyne or direct conversion receiver. A radio receiver in which the signal is converted to some IF is referred to as a superheterodyne receiver. The direct conversion receiver is simpler then the a superheterodyne receiver, and thus would be preferred for integrated circuit manufacture were it not for various inherent problems. One of these problems is that of local oscillator (LO) signal self mixing. Another of these problems is that of direct current (DC) voltage offsets which accumulate due to the some of the received information being close to the carrier frequency. Thus the greater complexity and cost of superheterodyne receivers is generally accepted as necessary for satisfactory communications, however superheterodyne receivers also have various inherent problems.

In a superheterodyne radio receiver one of the inherent problems is the generation of an image frequency signal. For example, an RF input signal is amplified in a low noise amplifier (LNA) before being mixed with some reference frequency signal generated by a local oscillator. The mixing produces a signal at a frequency being a difference of the reference frequency signal and the RF input signal. This difference frequency signal is referred to as an intermediate frequency (IF) signal. The IF signal is passed through a band pass amplifier, sometimes referred to as an IF strip or an IF stage, to eliminate unwanted signals and noise before detection of the information. One of the inherent problems in a superheterodyne receiver is that the mixing process generates an image frequency signal which is removed from the RF input signal by a sum of twice the difference between the reference frequency and the RF input signal. Typically the power of the image frequency signal is great enough that if only a small fraction of this signal leeks to the input of the superheterodyne receiver, it is also amplified along with the desired RF input signal. If any of the image frequency signal reaches the input of the mixer it is mixed down into the IF along with the input signal and interferes with the detection of the information being received in the RF input signal. Hence before the unwanted image frequency signal reaches the mixer it is desirably removed. Typically this is done with a filter that attenuates the image frequency signal.

In many radio receivers of present day manufacture, off-chip passive filters, such as surface acoustic wave (SAW) filters or ceramic filters, are used for image rejection. Since neither SAW nor ceramic filters have been practically implemented in an integrated circuit form, these filters represent a major impediment to reducing the cost of integrated circuit radio receiver a apparatus. The use of external filters also complicates the design of the radio receiver front-end. The output of a LNA drives a load impedance of the off-chip filter, typically of 50 ohms impedance, via two bond wires in the package used for the receiver. Bond wires are a major source of signal radiation. The bond wires contribute significantly to detrimental signal coupling or leakage between ports of the receiver, including the input port where the radio frequency signal is being received. Additional pins to accommodate the bond wire connections with the filter also increase the cost of packaging. This additional cost along with the cost of SAW or ceramic filters is a significant portion of the overall cost of a typical integrated circuit radio receiver.

Several filter types have been integrated in on-chip implementations of image rejection filters but in operation exhibit comparatively less desirable performance characteristics than the typical off-chip implementations of image rejection filters. Some designs have employed an additional stage to the radio receiver following the LNA for filtering out the image frequency signal. Implementations of these designs characteristically require significant extra circuitry which occupies corresponding significant extra chip area. In operation these designs consume a significant extra operating current. This extra circuitry is in series with the signal path of the received RF signal. Examples of these receivers typically exhibit poor noise characteristics and less than desirable linearity. On the other hand, advantageously the signal never has to leave the chip before reaching the IF stage in the receiver chain. If the reduction in the quality of detected information is tolerable, a more economical integrated circuit package is used as the beam leads and package pin-out needed for off-chip filter designs are avoided.

It has been suggested that a filter can also be included within a conventional integrated LNA topology to reduce amplification of an image frequency signal. A conventional LNA includes two transistors connected in cascode. In one example energizing power is applied to an output collector electrode of one transistor through a parallel resonated circuit having a low direct current resistance and a higher impedance at the frequency of signals intended for amplification. An emitter electrode of the other transistor is coupled to via an inductor to ground. Bias is applied to hold the transistors in a linear operating range such that RF signals coupled to the other transistor appear amplified at the output collector electrode. The inductor is constructed to have a value which presents a higher impedance at the emitter electrode for the unwanted image frequency signal than for signal frequencies of desired RF signals. Below the resonant frequency of the inductor the LNA operates with an inductive degeneration characteristic. It has also been suggested that an active tunable capacitance in parallel be used with the inductor to lower impedance and consequently increase gain at the desired RF signal frequencies.

In spite of these suggested integrated designs, at present if a radio receiver of uncompromised image rejection and low noise performance is required, the radio receiver is expected to include an external filter or filters of the SAW or ceramic filter types.

Consequently it is an object of the invention to reduce interference normally associated with image frequency signals in integrated circuit radio receivers.

SUMMARY OF THE INVENTION

In accordance with an aspect of the invention, an integrated circuit radio receiver, includes a radio frequency amplifier for amplifying radio frequency signals with an amplifying gain, an active impedance circuit being resonant at a predetermined radio frequency, and a coupling circuit connected between the radio frequency amplifier and the active impedance circuit. The coupling circuit exchanges energy between the radio frequency amplifier and the active impedance circuit at signal frequencies near the predetermined radio frequency such that the active impedance circuit is marginally non-oscillatory and said signal frequencies are amplified with a lesser gain than said amplifying gain.

In accordance with an other aspect of the invention, an integrated amplifier circuit including a notch filter comprises an amplifier for amplifying radio frequency (RF) signals with an amplifying gain, an oscillator circuit including a tank circuit having a resonant frequency for determining a frequency of oscillatory operation, a coupling transformer connected between the amplifier and the oscillator circuit for exchanging signal energies between the oscillator circuit and the amplifier, and a control circuit for maintaining the oscillator circuit in a marginally quiescent state of operation, whereby RF signals of frequencies near said resonant frequency are amplified with a lesser gain than said amplifying gain.

One example of an integrated circuit in accordance with the invention comprises:

power and ground terminals for connection across a source of energising direct current;

a differential amplifier having first and second transistors each with a collector electrode, an emitter electrode and a base electrode, and first and second inputs connected to the base electrodes of the first and second transistors respectively;

a first oscillator circuit with a tank circuit having a resonant frequency for determining a frequency of oscillatory signal energy during oscillatory operation, the tank circuit including an inductive winding;

a coupling transformer having a primary winding connected between the emitter electrodes of the first and second transistors and inductively coupled with the inductive winding of the tank circuit, the coupling transformer for coupling signal energies of frequencies near the resonant frequency, between the first oscillator circuit and the differential amplifier; and a bias circuit for biasing the first oscillator circuit into a marginally quiescent state of operation but what would otherwise be a marginally oscillatory state of operation were it not being inductively coupled by the coupling transformer, the bias circuit comprising:

a second oscillator circuit being similar to the first oscillator circuit;

a current control circuit, for limiting a flow of operating current for the second oscillator circuit;

a sensing circuit being responsive to oscillatory signal energies produced during oscillatory operation of the second oscillator circuit, for causing the current control circuit to further limit said current flow to the second oscillator circuit, whereby a gain of the second oscillator circuit is effectively reduced to maintain a marginal state of oscillatory operation at a frequency near said resonant frequency; and a current following circuit being coupled with the current control circuit for limiting a flow of operating current for the first oscillator circuit to be similar to said flow of operating current for the second oscillator circuit.

whereby signals applied to the differential amplifier are amplified with a first gain, except any signals of frequencies near said resonant frequency of the tank circuit in the first oscillator, said any signals being amplified with a lesser gain.

In one other example, the integrated amplifier circuit is in combination in a semiconductor substrate with an integrated circuit radio receiver which includes an intermediate frequency (IF) stage having an IF gain through a band width of a predetermined range of frequencies, and in accordance with yet another aspect of the invention, the frequency of the oscillatory operation of the second oscillator circuit is at variance with said resonant frequency of the tank circuit of the first oscillator circuit by an amount which exceeds said band width.

In accordance with yet an other aspect of the invention a method for receiving radio frequency (RF) signals for frequency conversion and detection while substantial reducing any frequency conversion of an image frequency signal, comprises the steps of:

operating a receiving amplifier with a receiving impedance to receive and amplify the RF signals with an amplifying gain;

operating a first oscillator with a resonance similar to the frequency of the image frequency signal;

operating a second oscillator with a resonances somewhat similar to the resonance of operation of the first oscillator;

reducing a gain of the second oscillator in response to an amplitude of oscillatory operation therein by an amount such that said oscillatory operation of the second oscillator is marginally sustained;

reducing the gain of the first oscillator by a similar amount in response to the reduction of the gain of the second oscillator; and coupling signal energy between the first oscillator and the receiving amplifier whereby loading of the first oscillator by the receiving amplifier damps the oscillatory operation of the first oscillator and said receiving impedance at frequencies near the frequency of the image frequency is higher than the receiving impedance at frequencies of the RF signals for frequency conversion and detection.

BRIEF DESCRIPTION OF THE DRAWINGS

Embodiments of the invention are discussed with reference to the accompanying drawings wherein.

DESCRIPTION

Figure 1:
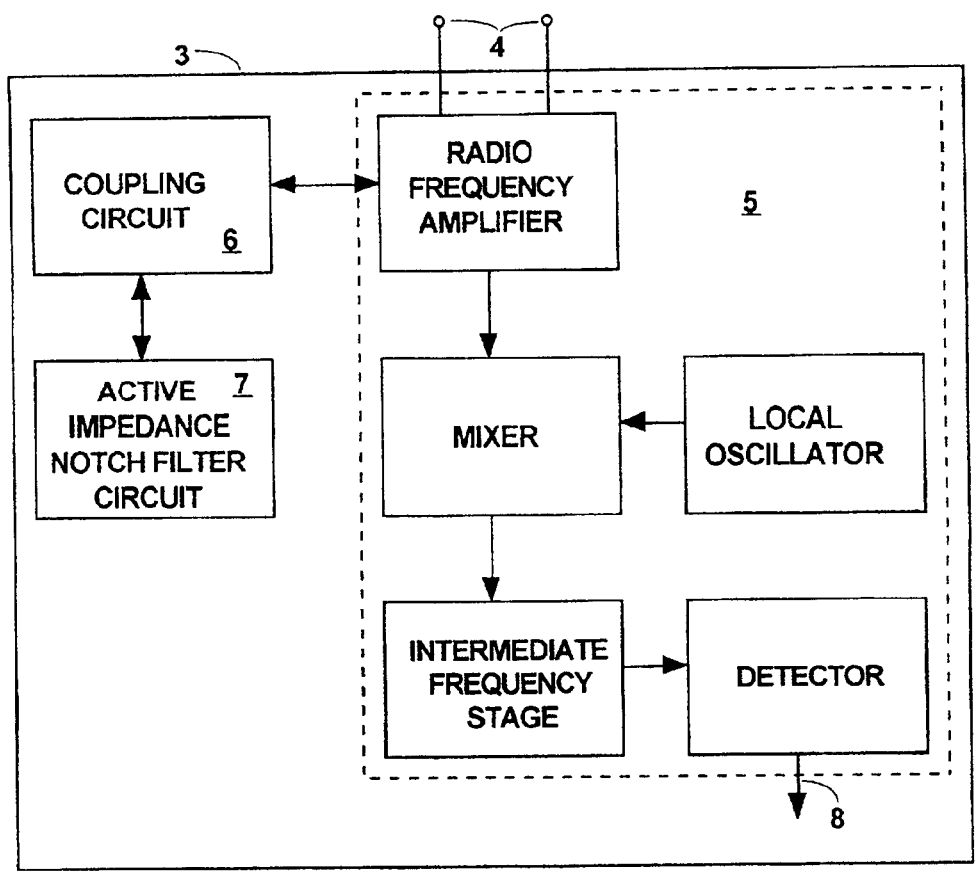
FIG. 1 is a block schematic diagram of a radio receiver integrated in a semiconductor substrate in accordance with the invention.

In FIG. 1, a semiconductor substrate 3 carries a typical integrated circuit superheterodyne radio receiver 5, for operation in the gigahertz range of frequencies. The superheterodyne radio receiver 5 includes a radio frequency (RF) amplifier for amplifying RF signals coupled to its input via beam leads connected to external terminals 4. Amplified RF signals from the RF amplifier are mixed with a local oscillator signal from a local oscillator by a mixer to generate signals of sum and difference frequencies. An intermediate frequency (IF) stage selectively amplifies one of the sum and difference frequency signals, preparatory to detection of any modulation of the IF signal by a detector for providing detected information at an output 8. Such modulation may include unwanted effects of an image frequency signal. The image frequency signal is an unwanted byproduct of the operation of virtually any practical mixer.

The unwanted effects of the image frequency signal are substantially reduced by providing on-chip filtering in combination with the RF amplifier to reduce its sensitivity to the image frequency signal. Accordingly, an active impedance notch filter circuit 7 and a coupling circuit 6 are integrated along with the radio receiver 5. The active impedance notch filter circuit 7 is coupled via the coupling circuit 6 for exchanging signal energy with the RF amplifier in the radio receiver 5. The active impedance notch filter circuit 7, in this example is tuned to have a characteristic resonance at the frequency of the image signal such that the gain of the radio frequency amplifier in the radio receiver near the frequency of the image signal is substantially reduced. The coupling circuit 6, and the active impedance notch filter circuit 7 being integrated on the semiconductor substrate 3 with the integrated circuit superheterodyne radio receiver 5 provides a manufacturing cost reduction.

Figure 2:
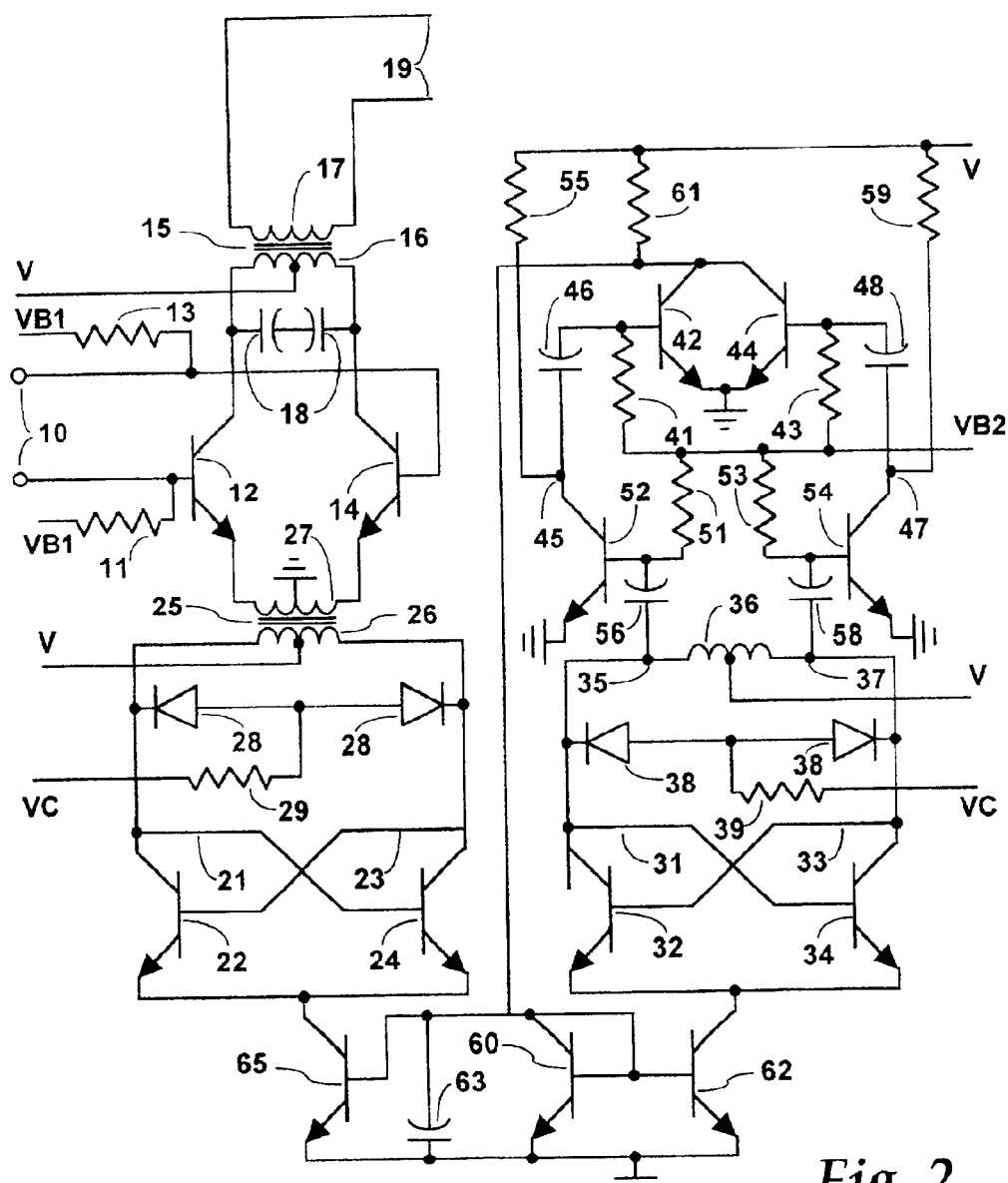
FIG. 2 is a detailed schematic diagram of an example of a radio frequency amplifier and an active impedance notch filter circuit used in FIG. 1.

One example of an active impedance notch filter circuit coupled with a radio frequency RF amplifier, and envisaged as being a design convenient for integrated circuit manufacture, is shown in FIG. 2. An RF amplifier is provided by a pair of transistors 12 and 14. Collector electrodes of the transistors 12 and 14 are connected across a primary winding 16 of an output transformer 15. Emitter electrodes of the transistors 12 and 14 are connected across a centre taped winding 27 of a coupling transformer 25. Base electrodes of the transistors 12 and 14 are connected to be differentially driven by an RF signal, when such is applied across a pair of input terminals 10. The base electrodes of the transistors 12 and 14 are coupled with a source of voltage bias VB1 via resistors 11 and 13 respectively, as shown. The output transformer 15 includes a secondary winding 17, connected to output leads 19, for providing an amplified RF signal to on-following radio receiver circuitry, not shown. Capacitors 18 are connected across the primary winding 16 to enhance the amplification of RF signals in a frequency band of interest. Energising current is supplied from a voltage supply V, via a centre tap of the primary winding 16 and ground connected at the centre tap of the winding 27. The transistors 12 and 14 are biased, via the resistors 11 and 13, into a linear area of operation such that RF signals applied differentially across the input terminals 10 are amplified with an amplifying gain and appear across the output leads 19. Although the frequency of an image signal is usually remote from the frequency band of interest, such signals can be amplified to appear at the output leads 19 with substantial signal energy, unless intercepted or rejected by a filter, for example, a notch filter as illustrated in FIG. 2.

The notch filter is provided by first and second oscillator circuits with gain controlled by slave and master biasing circuits in response to functioning of the second oscillator circuit as sensed by a sensing circuit. The first oscillator circuit is provided by circuit components labelled 21–26, 28 and 29. Transistors 22 and 24 are cross-coupled as shown via leads 21 and 23 in a bistable circuit configuration with collector electrodes connected across an inductive winding 26 of the coupling transformer 25. Emitter electrodes of the transistors 22 and 24 are connected in common with a collector electrode of a transistor 65. A pair of capacitance diodes 28, also known as varactor diodes, are connected in series opposition, as shown, across the winding 26 to provide a tank circuit which is tunable by a control voltage source VC applied via a resistor 29. Operating current is supplied from the voltage supply V via a centre tap of the inductive winding 26 and via a grounded emitter of the transistor 65. The transistor 65 is configured to operate as a current following or slave circuit, sometimes referred to as a current mirror, for limiting a flow of the operating current and thereby control the gain of the first oscillator circuit. The control of the gain of the first oscillator circuit is essential for optimal attenuation of any signal of a predetermined undesired frequency, for example the image frequency signal. Ideally the first oscillator is operated with sufficient gain to be in a marginally oscillatory state if it were not loaded by being coupled with the RF amplifier. When the first oscillator is coupled to the RF amplifier, loading quenches the marginal oscillations and thus achieves a desired marginally quiescent state of operation. However without oscillatory operation a problem arises in that there is no convenient reference for gain regulation. This problem is overcome by providing the second oscillator circuit which is similar to the first oscillator circuit and is used as a reference for gain regulation.

In integrated circuit manufacturing technologies, by nature, circuit elements of identical design geometries tend to have nearly identical operating characteristics. This nature of integrated circuits is use to advantage in the instant example.

In the example illustrated, the gain is controlled by limiting the flow of operating current for the second oscillator circuit in an inverse relationship to oscillatory signal amplitude therein. The gain in the first oscillator is regulated by limiting the flow of operating current for the first oscillator circuit to be the same as that for the second oscillator circuit.

The second oscillator circuit is provided by circuit components labelled 31–34, 36, 38 and 39 and as can be seen with reference to FIG. 2, the second oscillator is of similar structure as compared to the first oscillator circuit. Transistors 32 and 34 are cross-coupled via leads 31 and 33 in a bistable circuit configuration with collector electrodes connected across an inductive winding 36. Emitter electrodes of the transistors 32 and 34 are connected in common with the collector electrode of a transistor 62. A pair of varactor diodes 38, connected across the inductive winding 36, provide a tank circuit which is tunable by the control voltage source VC via a resistor 39. Operating current is supplied from the voltage supply V, via a centre tap of the inductive winding 36 and via a grounded emitter electrode of the transistor 62, configured to operate as a current mirror.

A bias control circuit for controlling the gains of the first and second oscillator circuits is provided by circuit components labelled 41–44, 46, and 48. Transistors 42 and 44 are have emitter electrodes connected to ground and collector electrodes coupled to the voltage supply V via a resistor 61. The base electrodes of the transistors 42 and 44 are connected to a source of bias voltage VB2 by resistors 41 and 43 and are coupled by capacitors 46 and 48 to junctions 45 and 47. In one example of less complexity than the example shown in FIG. 2, the junctions 45 and 47 are directly connected across the inductive winding 36 at junctions 35 and 37 respectively, but in the illustrated example an additional stage of amplification is provided by circuit components 51–56, 58 and 59. This additional stage of amplification improves the velocity and precision with which optimal operating gain control is achieved. In the additional stage of amplification transistors 52 and 54 have emitter electrodes connected to ground and collector electrodes coupled to the voltage supply V, via resistors 55 and 59. The base electrodes of the transistors 52 and 54 are connected to the source of bias voltage VB2, by resistors 51 and 53, and are coupled by capacitors 56 and 58 to the inductive winding 36, via the junctions 35 and 37 respectively. A transistor 60 is connected in a current source configuration, as shown, with the resistor 61 and ground to provide a master bias control circuit and a capacitor 63 is connected between the resistor 61 and ground.

At a moment when power is applied across the power terminals V and ground, initially the oscillator circuits are inactive. Current conduction through the transistor 60 rises until a limit is established by the voltage drop across the resistor 61 and the base emitter junction drop across the transistor 60. Current conductions through the transistors 62 and 65 mimic current conduction through the transistor 60. The value of the resistor 61 is chosen to provide sufficient current to initiate oscillatory operation in the second oscillator circuit. If the second oscillator circuit were in a quiescent state, that is not oscillating, the transistors 52 and 54 as well as the transistors 42 and 44 are biased to be non-conductive by the source of bias voltage VB2. When the second oscillator circuit is oscillating, as it usually is, the positive peaks of the oscillatory signal cause the transistors 52 and 54 to alternately conduct and consequently transistors 42 and 44 alternately conduct even more vigorously. Conduction by the transistors 42 and 44 increases the voltage drop across the resistor 61 and consequently reduces the flow of operating current for the second oscillator circuit via the transistor 62. The second oscillator settles into a current starved mode of operation such that current conductions by the transistor pair 32 and 34 are mutually exclusive occurrences resembling that of a class C amplifier operation. The transistor 65 provides a slave bias circuit which mimics or mirrors current conduction via the transistors 60 and 62. Hence the first oscillator likewise settles into a current starved mode of operation, however as its tank circuit is loaded by coupling to the RF amplifier its initial oscillations, if any, are quenched. Accordingly the first oscillator assumes a marginally quiescent state of operation.

Hence a narrow stop band or notch filter function is achieved. RF input signals in a band of interest appear on the output leads 19 being amplified with a first gain. As the tank circuit in the first oscillator circuit is tuned to the image frequency. Each half of the winding 27 of a coupling transformer 25 provides an impedance in series with each of the emitter electrodes of the transistors 12 and 14. The impedance is sharply increased for signals near the frequency of the notch so that little, ideally none, of the image frequency signal traverses the RF amplifier.

In an example of a superheterodyne radio receiver the second oscillator circuit is preferably designed to be at slight variance with first oscillator circuit to avoid having an on-chip signal energy source operating at the same frequency as the frequency of an image signal. For example if the superheterodyne radio receiver is designed to receive signal frequencies at about 5 gigahertz with an intermediate frequency stage bandwidth of say 16 megahertz, the area of the junctions of the varactor diodes 38 is reduced by a small amount, maybe 1 percent, to increase the operating frequency of the second oscillator circuit by about 50 megahertz as compared to the resonant frequency of the tank circuit in the first oscillator circuit. This is sufficiently above the frequency of the image frequency signal such that any mixing of the second oscillator signal and with the local oscillator signal will result in signals outside the pass band of intermediate frequency stage and of no real consequence to the intended or actual function of the radio receiver.

Another modification may substitute indirect cross coupling with resistive or reactive components in either of the first and second oscillator circuits. Yet another modification may substitute a single ended LNA for the RF amplifier illustrated in FIG. 2. Readers of the foregoing discloser, will envisage various other embodiments within the spirit and scope of the present invention, the breadth of which is of record in the appended claims.

What is claimed is:

1. An integrated amplifier circuit, comprising;

a transistor amplifier having an input for receiving radio frequency (RF) signals and amplifying received RF signals with an amplifying gain;

a local oscillator for generating a local oscillator signal;

a mixer for generating an intermediate signal by mixing signals from the transistor amplifier and the local oscillator;

a tank circuit with a resonant frequency substantially corresponding to a frequency of an undesired RF signal;

a coupling circuit for coupling the tank circuit with the transistor amplifier; and an active impedance circuit comprising:

an oscillator circuit including an amplifier connected with the tank circuit such that a frequency of oscillatory operation substantially corresponds to the frequency of said undesired RF signal, a gain of the amplifier being variable through a range from a maximum gain being sufficient for oscillatory operation through a lesser gain;

a gain control circuit for generating an operating gain in said range and tending toward said lesser gain, such that coupling via the coupling circuit quenches oscillatory operation and said amplifying gain of the transistor amplifier at signal frequencies near the frequency of said undesired RF signal is reduced wherein said tank circuit is a first tank circuit, said oscillator circuit is a first oscillator circuit, and wherein the gain control circuit comprises:

a second tank circuit and a second oscillator circuit being substantially similar to the first tank circuit and the first oscillator circuit, respectively;

a master gain control circuit for varying a gain of the second oscillator for initiating oscillatory operation of the second oscillator and thereafter altering the gain of the second oscillator in inverse relationship to an amplitude of oscillations in the second oscillator for marginally sustaining oscillatory operation of the second oscillator; and a slave gain control circuit responsive to the master gain control circuit such that said operating gain of the first oscillator substantially corresponds to the gain of the second oscillator.

2. An integrated amplifier circuit as defined in claim 1 wherein the frequency of oscillatory operation of the second oscillator circuit is at variance with the frequency of oscillatory operation of the first oscillator circuit.

3. An integrated amplifier circuit as defined in claim 2 further comprising:

an intermediate frequency (IF) stage having an IF gain through a band width of a predetermined range of frequencies, and wherein the frequency of the oscillatory operation of the second oscillator circuit is at variance with the frequency of the oscillatory operation of the first oscillator circuit by an amount which exceeds said band width.

4. An integrated amplifier circuit including a notch filter, comprising:
  an amplifier for amplifying radio frequency (RF) signals with an amplifying gain;
  an oscillator circuit including a tank circuit having a resonant frequency for determining a frequency of oscillatory operation;
  a coupling transformer connected between the amplifier and the oscillator circuit for exchanging signal energies between the oscillator circuit and the amplifier;
  a control circuit for maintaining the oscillator circuit in a marginally quiescent state of operation, whereby RF signals of frequencies near said resonant frequency are amplified with a lesser gain than said amplifying gain wherein the oscillator circuit is a first oscillator circuit, and the control circuit comprises:
  a second oscillator circuit being substantially similar to the first oscillator circuit;
  a master bias circuit being responsive to an amplitude of oscillatory signals in the second oscillator circuit for supplying a master bias current for operating the second oscillator circuit in a marginally oscillatory state;
  a slave bias circuit connected with the first oscillator circuit for supplying a slave bias current thereto, the slave bias circuit being responsive to the master bias circuit for controlling the slave bias current to be similar to the master bias current, whereby the first oscillator circuit is maintained in said marginally quiescent state of operation.

5. An integrated amplifier circuit as defined in claim 4 in integrated combination in a semiconductor substrate with an integrated circuit radio receiver which includes an intermediate frequency (IF) stage having an IF gain through a band width of a predetermined range of frequencies, and wherein the frequency of the oscillatory operation of the second oscillator circuit is at variance with the frequency of the oscillatory operation of the first oscillator circuit by an amount which exceeds said band width.

6. An integrated amplifier circuit including a notch filter, comprising:
  power and ground terminals for connection across a source of energising direct current;
  a differential amplifier having first and second transistors each with a collector electrode, an emitter electrode and a base electrode, and first and second inputs connected to the base electrodes of the first and second transistors respectively;
  a first oscillator circuit with a tank circuit having a resonant frequency for determining a frequency of oscillatory signal energy during oscillatory operation, the tank circuit including an inductive winding;
  a coupling transformer having a primary winding connected between the emitter electrodes of the first and second transistors and inductively coupled with the inductive winding of the tank circuit, the coupling transformer for coupling signal energies of frequencies near the resonant frequency, between the first oscillator circuit and the differential amplifier;
  a bias circuit for biasing the first oscillator circuit into a marginally quiescent state of operation but what would otherwise be a marginally oscillatory state of operation were it not for said coupling of signal energies;
  whereby signals applied to the differential amplifier are amplified with a first gain, except for signals of frequencies near said frequency of oscillatory operation which are amplified with a lesser gain.

7. An integrated amplifier circuit including a notch filter as defined in claim 6 wherein the bias circuit comprises:
  a second oscillator circuit being similar to the first oscillator circuit;
  a current control circuit being similar a current source in operation, for limiting a flow of operating current for the second oscillator circuit;
  a sensing circuit being responsive to oscillatory signal energy during oscillatory operation of the second oscillator circuit, for causing the current control circuit to further limit said current flow to the second oscillator circuit, whereby a gain of the second oscillator circuit is effectively reduced to maintain a marginal state of oscillatory operation; and
  a current following circuit being coupled with the current control circuit for limiting a flow of operating current for the first oscillator circuit to be similar to said flow of operating current for the second oscillator circuit.

8. An integrated amplifier circuit including a notch filter as defined in claim 7 wherein the second oscillator circuit is at variance with the first oscillator circuit in that its frequency of oscillatory operation is greater than the frequency of oscillatory operation of the first oscillator circuit.

9. An integrated amplifier circuit including a notch filter as defined in claim 6 further comprising;
  in the first oscillator circuit;
  a first pair of capacitance diodes connected in series opposition across the inductive winding and defining a junction therebetween and a resistance connected to the junction for application of a control voltage for controlling a capacitance of each of the capacitance diodes, whereby the resonant frequency of the tank circuit is controllable;
  a pair of transistors having emitter electrodes connected in common, collector electrodes connected across the tank circuit and base electrodes cross-coupled with the collector electrodes;
  in the bias circuit;
  a second oscillator circuit structurally similar to the first oscillator circuit;
  a first transistor having an emitter electrode connected to one of the power terminals and base and collector electrodes connected in common via a resistance to the other of the power terminals;
  a sensing amplifier connected to draw operating current in common with the collector electrode of the first transistor in response to oscillatory signals in the tank circuit of the second oscillator;
  a master feed circuit having a transistor with a collector electrode connected to the emitter electrodes of the pair of transistors in the second oscillator circuit, an emitter electrode connected to said one of the power terminals and a base electrode connected to the collector electrode of the first transistor; and
  a slave feed circuit having a transistor with a collector electrode connected to the emitter electrodes of the pair of transistors in the first oscillator circuit, an emitter electrode connected to said one of the power terminals and a base electrode connected to the collector electrode of the first transistor;
  whereby the bias circuit is responsive to oscillatory operation of the second oscillator circuit for causing currents in the master and slave feed circuits to be reduced toward cut-off thereby holding the pair of transistors, in the second oscillator circuit, in class C operation.

10. An integrated amplifier circuit including a notch filter as defined in claim 9 wherein the second oscillator circuit is at variance with the first oscillator circuit in that a sum of the junction areas of the capacitance diodes in the second oscillator circuit is different than a sum of the junction areas of the capacitance diodes in the first oscillator circuit, whereby the frequencies of oscillatory operations of the first and second oscillator circuits is correspondingly different.

11. An integrated amplifier circuit including a notch filter as defined in claim 9 wherein the sensing amplifier comprises;
   a pair of transistors with emitter electrodes connected to said one of the power terminals, collector electrodes connected in common with the collector electrode of the first transistor in the bias circuit and base electrodes capacitively coupled across the tank circuit of the second oscillator and resistively coupled to a source of bias voltage.

12. An integrated amplifier circuit including a notch filter as defined in claim 9 wherein the sensing amplifier comprises:
   a first pair of transistors with emitter electrodes connected to said one of the power terminals, collector electrodes connected in common with the collector electrode of the first transistor in the bias circuit and base electrodes resistively connected to a source of bias voltage;
   a second pair of transistors with emitter electrodes connected to said one of the power terminals, base electrodes capacitively coupled across the tank circuit of the second oscillator circuit and resistively connected to the source of bias voltage, and collector electrodes each resistively connected to the other of the power terminals and capacitively coupled with a respective one of the base electrodes of the first pair of transistors;
   the source of bias voltage providing a bias for maintaining said first and second pairs of transistors in nominally cutoff states being conductive only in response to peaks of the oscillatory signal energy in the second oscillator.

13. A method for receiving radio frequency (RF) signals for frequency conversion and detection while substantial reducing any frequency conversion of an image frequency signal, comprising the steps of:
   operating a receiving amplifier with a receiving impedance to receive and amplify the RF signals with an amplifying gain;
   operating a first oscillator with a resonance similar to the frequency of the image frequency signal;
   operating a second oscillator with a resonances somewhat similar to the resonance of operation of the first oscillator;
   reducing a gain of the second oscillator in response to an amplitude of oscillatory operation therein by an amount such that said oscillatory operation of the second oscillator is marginally sustained;
   reducing the gain of the first oscillator by a similar amount in response to the reduction of the gain of the second oscillator; and
   coupling signal energy between the first oscillator and the receiving amplifier whereby loading of the first oscillator by the receiving amplifier damps the oscillatory operation of the first oscillator and said receiving impedance at frequencies near the frequency of the image frequency is higher than the receiving impedance at frequencies of the RF signals for frequency conversion and detection.

* * * * *